United States Patent [19]

Butterbaugh et al.

[11] Patent Number: 5,782,986
[45] Date of Patent: Jul. 21, 1998

[54] PROCESS FOR METALS REMOVAL USING BETA-DIKETONE OR BETA-KETOIMINE LIGAND FORMING COMPOUNDS

[75] Inventors: Jeffery W. Butterbaugh, Chanhassen, Minn.; David C. Gray, Sunnyvale, Calif.

[73] Assignee: FSI International, Chaska, Minn.

[21] Appl. No.: 584,179

[22] Filed: Jan. 11, 1996

[51] Int. Cl.$^6$ .................................................. B08B 7/00
[52] U.S. Cl. .................................. 134/1.3; 134/1; 134/26
[58] Field of Search ..................... 134/1, 1.3, 2, 26, 134/30

[56] References Cited

U.S. PATENT DOCUMENTS

| | | | |
|---|---|---|---|
| 4,498,953 | 2/1985 | Cook et al. | 156/646 |
| 4,741,800 | 5/1988 | Yamazaki | 156/643 |
| 4,871,416 | 10/1989 | Fukuda | 156/635 |
| 5,022,961 | 6/1991 | Izumi et al. | 156/646 |
| 5,028,560 | 7/1991 | Tsukamoto et al. | 437/81 |
| 5,068,040 | 11/1991 | Jackson | 210/748 |
| 5,094,701 | 3/1992 | Norman et al. | 148/23 |
| 5,145,508 | 9/1992 | Fujiura et al. | 65/388 |
| 5,178,682 | 1/1993 | Tsukamoto | 118/722 |
| 5,178,721 | 1/1993 | Sugino | 156/626 |
| 5,213,621 | 5/1993 | Ivankovits et al. | 134/3 |
| 5,213,622 | 5/1993 | Bubling et al. | 134/3 |
| 5,221,366 | 6/1993 | Roberts et al. | 148/22 |
| 5,221,423 | 6/1993 | Sugino et al. | 156/643 |
| 5,228,206 | 7/1993 | Grant | 34/1 |
| 5,234,540 | 8/1993 | Grant et al. | 156/646 |
| 5,332,444 | 7/1994 | George et al. | 134/1 |
| 5,368,687 | 11/1994 | Sandhu et al. | |

FOREIGN PATENT DOCUMENTS 7-154004  6/1995  Japan .

OTHER PUBLICATIONS

Handbook of Semiconductor Wafer Cleaning Technology, editor W. Kern, Noyes Publications pp. 210–213, 219–224 and 233–273, 1993.

Lynn R. Allen, et al. "Vacuum ultraviolet substrate cleaning and etching", The Solid State Technology, pp. 77–80, May 1995.

Jerzy Ruzyllo, "Issues in Dry Cleaning of silicon Wafers", Solid State Technology, pp. S1–S4, Mar. 1990.

*Primary Examiner*—Jill Warden
*Assistant Examiner*—Alexander Markoff
*Attorney, Agent, or Firm*—Vidas, Arrett & Steinkraus, P.A.

[57] ABSTRACT

UV irradiation enhances oxidation of metal and/or formation of sublimable ligand compounds using beta-diketone or beta-ketoimine ligand forming compounds. A UV/halogen gas or UV/ozone treatment can be used to efficiently oxidize the metallic material to a suitable form for reaction with the ligand forming compound and UV irradiation can be used during exposure to the ligand forming compound to enhance the formation of sublimable ligand compounds. Oxidization and ligand compound formation can be run sequentially or simultaneously. The process can be used for bulk metals removal, metal film patterning or trace metals removal.

24 Claims, No Drawings

1

PROCESS FOR METALS REMOVAL USING BETA-DIKETONE OR BETA-KETOIMINE LIGAND FORMING COMPOUNDS

FIELD OF THE INVENTION

The present invention pertains to a process for gas phase removal of metals from substrates such as semiconductor devices and micromechanical devices.

BACKGROUND OF THE INVENTION

In the manufacture of semiconductor devices, trace metal contaminants and metallization problems degrade both semiconductor processes and device yields. Trace metals may remain on the wafer surface after any possible cleaning step as well as after any oxidation, diffusion, photolithographic, and metallization process. In order for devices to function properly, these contaminants must be removed. Removing them becomes even more critical as device structures shrink into the submicron region. Residues can build up particularly in the dielectric pass throughs, or vias, and submicron contact holes. Such residues will interfere with subsequent process steps and they will cause spurious growth problems and high metal to metal contact resistance. These problems are particularly difficult because they are usually evaluated electrically, not visually. That means they are found much later and not at the point of contamination.

Metallization problems center around particulates and step coverage. Particulates can form in the narrow linewidths associated with VLSI. Step coverage concerns make metal etching particularly difficult, especially with the small geometries used in VLSI. "Because metal is attacked beneath the etch mask, compensation must be made for the linewidth lost in transferring the lithographic pattern to the etched metal. As stated in VLSI Technology, edited by S. M. Sze, McGraw-Hill, 1983, p. 362, "as lateral dimensions decrease and lines get closer together, compensation becomes physically impossible; anisotropic etching of the metal is therefore necessary." These metal problems are particularly troublesome because they occur so late in the process sequence and much time and expense has already been invested in the actual devices. In VLSI devices, the problems are compounded by placing metal lines close together and imposing an electric filed between them. Junction spiking, electromigration, and step coverage have driven much research and process development. Ongoing refinements have occurred in metallization, polysilicon deposition, cleaning, and etching processes.

Many different etching and cleaning techniques have been developed for various semiconductor processes. Typically in the past, wet etches, such as "RCA Clean", dominated in semiconductor fabrication processes. Gradually, as device structures have shrunk and the move toward VLSI devices grown, dry etches have gained prominence. These dry etches include plasma and gas-based etches and many were developed originally for removing oxides and carbon-based contaminants. An in-situ removal process that directionally etches away material in one plane at a much different rate than in another plane would be vastly helpful in controlling trace metals and step coverage.

U.S. Pat. No. 4,741,800 discloses a process using microwave energy to facilitate semiconductor etching. U.S. Pat. No. 5,228,206 and U.S. Pat. No. 5,234,540 disclose use of ultraviolet (hereafter, UV) light to aid oxide etching. In U.S. Pat. No. 5,022,961, use of anhydrous HF and alcohol gases to remove films on Si layers is described.

In copending application Ser. No. 08/259,542, filed Jun. 14, 1994, there is disclosed a method for removing native oxides and other contaminants from a wafer surface while minimizing the loss of a desired film on the wafer surface. The method is carried out in a hermetically sealed reactor. A fluorine-containing gas or gas mixture is passed over the wafer during simultaneous exposure to UV irradiation in the absence of added water, hydrogen, hydrogen fluoride or hydrogen containing organics, thereby avoiding the production of water as a reaction product. The addition of UV irradiation and the elimination of water, hydrogen, hydrogen fluoride and hydrogen containing organics provides for the nearly equivalent (non-selective) removal of various forms of oxide and also provides for improved process control.

In copending application Ser. No. 08/292,359, filed Aug. 18, 1994, a UV light-enhanced process for rapidly stripping films of silicon nitride in a dry reaction environment, which may be free of plasma or plasma effluents is disclosed. This process is carried out in a sealed reactor which allows simultaneous exposure of a substrate wafer to a polyatomic fluorine containing gas which can be photodissociated by UV irradiation to produce atomic fluorine. Silicon nitride stripping rates in excess of 500 Å/min are readily obtainable with UV-stimulated fluorine-based processes, while maintaining the bulk wafer temperature below 300° C. Selectivities for silicon nitride-to-silicon oxide etching of greater than 30 can be achieved for the stripping of silicon nitride LOCOS mask layers in the presence of field oxide and pad oxide layers when a chlorine or bromine containing gas which can be photodissociated by UV radiation to produce atomic chlorine or bromine is used in a mixture with the fluorine containing gas.

For dry gas-phase metal removal several systems have been reported. U.S. Pat. No. 5,094,701 and U.S. Pat. No. 5,221,366 disclose use of beta-diketone and beta-ketoimine ligand forming compounds, which are dispersed in an oxidizing atmosphere. At a sufficient temperature, volatile metal-ligand complexes are reported to be formed and then sublimed from the surface. Temperatures of 200°–300° C. are indicated to be required. U.S. Pat. No. 5,213,621, U.S. Pat. No. 5,213,622, and U.S. Pat. No. 5,332,444 disclose other ligand forming chemical reagents which reportedly can be used in a similar manner to form volatile metal-ligand complexes with surface impurities which then can be sublimed from the surface.

Despite the techniques advanced in the various references described above, there continues to be a need for improved dry processes for precise removal of trace metals from semiconductor substrates and substrates in micromechanical devices and the like.

SUMMARY OF THE INVENTION

The invention is an improved method for removing metals from semiconductor substrates, in which the method utilizes beta-diketone or beta-ketoimine ligand forming compounds. The invention in its various forms utilizes UV irradiation to enhance oxidation of metal and/or formation of sublimable ligand compounds. In one aspect of the invention, using an oxidizing atmosphere during reaction with the ligand forming compound can be replaced by sequencing the reaction to follow a UV/halogen gas or UV/ozone treatment. In another aspect of the invention, UV irradiation during exposure of the oxidized metal to the ligand forming compound has been shown to accelerate the reaction to a rate which gives effective removal under conditions which do not produce metal removal in the absence of irradiation.

In accordance with the first mentioned aspect of the invention, (a) the substrate is subjected to UV irradiation and exposure to a gas selected from the group consisting of ozone and gases which provide atomic halogen or atomic oxygen upon irradiation, and (b) the substrate is exposed to a gaseous beta-diketone or a beta-ketoimine ligand forming compound. The use of step (a) assures that the metal to be removed is efficiently oxidized to a suitable ligand-binding form as oxide or halide and can be effectively run at chamber temperatures below 100° C.

In accordance with the second mentioned aspect of the present invention, an oxidized metallic material is removed from a substrate by exposing the substrate to a gaseous environment comprising a beta-diketone or a beta-ketoimine ligand forming compound while irradiating with ultraviolet light.

In a preferred embodiment of this aspect of the invention, UV irradiation is employed to enhance both oxidation of the metal and ligand formation. In this embodiment, the oxidation and ligand formation reactions may be run sequentially or simultaneously.

DETAILED DESCRIPTION OF THE INVENTION

The substrate, on which the invention may be employed to remove metallic materials, may be any semiconductor substrate material, including silicon or gallium arsenide. The substrate may also be in a micromechanical device or a related functional device. This invention may be used at many different steps in the semiconductor fabrication process and silicon oxide may cover some or all of the substrate surface. Depending on the specific process step, the silicon oxide may be a doped oxide film, a CVD (chemical vapor deposition) oxide film, or a thermal oxide film. If a doped oxide film, it may be composed of boron or phosphorus doped silica glass, phosphorus doped silica glass, boron doped silica glass, or spin on glass. If the silicon oxide is a thermally grown field oxide, it may be formed as a result of a LOCOS process. Also, since this operation may occur at different steps, there may be a composite film structure on the silicon surface. The film structure may include alternating layers of undoped silicon oxide and doped silicon oxide.

The beta-diketone and beta-ketoimine ligand forming compounds can themselves be prepared according to methods well known in the art. U.S. Pat. No. 5,221,366 lays out their specific chemical formulas. The beta-diketone or beta-ketoimine ligand forming compound is represented by the formula:

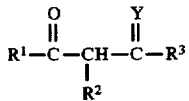    I wherein:

R$^1$ and R$^3$ are independently selected from a linear or branched non-fluorinated, partially-fluorinated or fully fluorinated alkyl, alkenyl or aryl group having from 1 to about 8 carbon atoms;

R$^2$ is a hydrogen atom, a fluorine atom or a linear or branched non-fluprinated, partially-fluorinated or fully fluorinated alkyl or alkenyl group having from 1 to about 8 carbon atoms; and Y is selected from an oxygen atom; N—R$^4$ wherein R$^4$ is selected from a non-fluorinated, partially fluorinated, or fully fluorinated alkyl, aryl, aralkyl or hydroxyalkyl group having from 1 to about 10 carbon atoms, or Y is

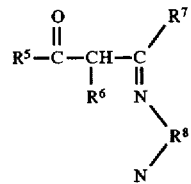    II wherein:

R$^5$, R$^6$, and R$^7$ are independently selected from a hydrogen atom, a fluorine atom or a linear or branched non-fluorinated, partially fluorinated or fully fluorinated alkyl or alkenyl group having from 1 to about 8 carbon atoms; and R$^8$ is a linear or branched non-fluorinated, partially fluorinated or fully fluorinated alkylene, alkenylene, phenylene, alkylphenylene or hydroxalkylene group having from 1 to about 8 carbon atoms.

Formula I represents three distinct types of ligand forming compounds which are each suitable for practicing the etching process of the present invention. Each of the three types is characterized by the definition of the Y group. When Y is an oxygen atom, the ligand forming compound is a beta-diketone. When Y is N—R$^3$, the ligand forming compound is a beta-ketoimine. Finally, when Y is represented by the structure according to Formula II, the ligand forming compound comprises two beta-ketoimines bridged by an organic functionality.

Representative ligand forming compounds suitable for use in the present invention include the following compounds:

4-(2,2,2-trifluoroethyl)-imine-1,1,1,5,5,5-hexafluoro-2-pentanone;

5-(2,2,2-trifluoroethyl)imino-1,1,1,2,2,6,6,6-octafluoro-3-hexanone;

6-(2,2,2-trifluoroethyl)imino-1,1,1,2,2,3,3,7,7,7-decafluoro-4-heptanone;

4-(phenyl)imino-1 1,1,5,5,5-hexafluoro-2-pentanone;

4-(2-hydroxyethyl)imino-1,1,1,5,5,5-hexafluoro-2-pentanone;

1,2-di(4-imino-1,1,1,5,5,5-hexafluoro-2-pentanone)ethane;

1,2-di(5-imino-1,1,1,2,2,6,6,6-octafluoro-3-hexanone)ethane;

1,2-di(6-imino-1,1,1,2,2,3,3,7,7,7-decafluoro-4-heptanone)ethane;

bis[4-(methylene)imino-1,1,1,5,5,5-hexafluoro-2-pentanone]methane;

bis(4-(methylene)imino-1,1,1,5,5,5-hexafluoro-2-pentanone]methanol.

A preferred ligand forming compound used for trace metal removal is 1,1,1,5,5,5-Hexafluoro-2,4-pentanedione (HFAC), which is commercially available from Air Products and Chemicals, Inc., Allentown, Pa.

A ligand bubble assembly, or ligand injection system, is added to an UV process module so that the beta-diketone ligand forming compound may be introduced. For instance, a HFAC bubbler may be installed on an UV process module to allow the introduction of HFAC in a nitrogen carrier stream which is bubbled through liquid HFAC and metered into the vacuum system through a rotometer. Approximately 10 sccm HFAC may be "picked" up in a 100 sccm stream of nitrogen when HFAC is at room temperature. The HFAC concentration may be increased by controlling its temperature. HFAC exposure is most effective at relatively high partial pressure and substrate temperatures in the range of 100°–400° C. Deleterious effects due to the HFAC do not occur on the anodized aluminum, sapphire, or other reactor surfaces. HFAC may be introduced in sequence after a UV/halogen process or during such a process. For example, the UV may be combined with $ClF_3$, $Cl_2$, or $O_3$.

Beta-diketone and beta-ketoimine ligand forming compounds typically only remove metals from surfaces if the metals are in their oxidation states obtained through the formation of oxides or halides of the metals. Consequently, an oxidizing environment is indicated in U.S. Pat. No. 5,221,366 as being required for beta-diketone and beta-ketoimine ligand forming compounds to react effectively. However, when the metal components to be removed have already been fully oxidized, the ligand forming compound may be utilized in a neutral environment, for instance with only a carrier gas. This is the case for trace metal contaminants which remain after using a UV/halogen process for a silicon oxide or silicon nitride etching or cleaning operation. Similarly, UV/ozone exposure prior to treatment with the ligand forming compound allows for the conversion of metals or metal compounds into ligand reactable oxides.

The UV/halogen processes are disclosed in U.S. patent applications Ser. No. 08/259,542 and Ser. No. 08/292,359. An apparatus particularly suitable for practice of the inventive method is disclosed in Ser. No. 08/360,387, filed Dec. 21, 1994, incorporated herein by reference. UV/ozone treatment processes can be practiced using the same apparatus.

Suitable metals removable by this process include metals such as Cu, Fe, Ni, Au, Sb, In and Cr. These metals are very bothersome trace contaminants from and during many semiconductor processes. Al, Yb, Mn and Pb may also be removed using the inventive processes. Once these metals are in a volatilizable form, they react with the beta-diketone and beta-ketoimine ligand forming compounds to form a volatile metal-ligand complex on the surface of the substrate. Then, the volatile metal-ligand complex is sublimed from the surface.

Since the metals are removed from the surface without going through a liquid phase, the temperature is maintained below the triple point of the compounds. This instant vapor-phase etching process overcomes numerous problems associated with wet etching solutions. This process avoids recontamination via exposure to other contaminants. It eliminates the necessity for exposing the substrate to the clean room environment during apparatus transfer. Also, it leaves essentially no residue on the metallic layer or substrate which might interfere with subsequent manufacturing steps. As a result, the sublimation process provides a clean, substantially residue-free surface.

The process can remove successive layers of metallic film. Also, certain metal-containing materials can be selectively removed over others. To do so, the reaction of the with a particular metal-containing contaminant must occur more rapidly than with other contaminants residing on the substrate's surface. Then, selective removal occurs by merely selecting the appropriate cleaning agent and controlling the process temperature and pressure of the cleaning agent.

As a trace metal contamination removal process, the inventive process may follow a vapor phase etching or cleaning step for removing silicon oxide or silicon nitride or it may follow an ozone or UV and ozone oxidizing step. However, such steps may also be run in combination. For example, a HFAC treatment may be combined in a single step with a feed of $ClF_3$, $Cl_2$, or ozone and UV irradiation to simultaneously etch silicon oxide or nitride, oxidize the metal, and form a volatile metal-ligand complex.

As an example of bulk metal removal, unmasked portions of a deposited metal layer may be oxidized with UV irradiation and halogen or ozone gas and simultaneously treated with HFAC or subsequently treated with HFAC and UV.

The metal-ligand compound products of the reaction are removed by sublimation. The sublimation temperature is chosen to achieve the desired sublimation rate. Needed is a temperature high enough to form a volatile metal-ligand complex and low enough that the volatile metal-ligand complex does not decompose. Substrate surface temperatures range from 50° C. to 400° C., preferably from 100° C. to 300° C. The temperature of the chamber can be maintained below these temperatures, however, when UV irradiation is utilized while the substrate is exposed to the ligand forming compounds since the light source produces localized heating of the substrate surface during irradiation.

Process times for formation and sublimation of the ligand compounds will vary depending on trace contamination or bulk metal removal is desired and, in the case of bulk removal, the thickness of the layer to be removed. For layers in the range of 500–5000 Å, process times will typically range from 0.5 to 50 minutes, with 2–10 minutes typical when the UV irradiation is utilized to enhance the ligand compound formation reaction. The processes for metal oxidization and for formation and sublimation of the ligand compounds may be run at 10–760 torr, preferably, at 90–110 torr total pressure. Suitably the chamber is first pumped down to a very low pressure, for instance <10 mtorr, to evacuate the chamber before beginning gas feed.

The partial pressure of each reactant gas is in the range of 10–760 torr.

The total gas flow rates are 100–2000 sccm. The ligand forming compound gas flow may be 5–500 sccm, preferably 8–12 sccm ligand gas in 75–125 sccm nitrogen. For light cleaning, the ligand forming compound gas phase concentration may be as low as 1% of total gas, while in bulk stripping, ligand forming compound gas may be 40% of total gas. Preferably, a 5–25% ligand forming compound concentration is used.

Broadband UV radiation in the wavelength range of 180–600 nm may be used, as may narrower band sources providing substantial output in the 180–420 nm range. Suitable sources are medium pressure Hg lamps and Xenon lamps. The UV radiation may be pulsed or continuous. A laser and suitable optics may also be used to generate the required UV photon flux. Substrate film and contaminant removal rates may be controlled to a large degree by the intensity of the UV radiation, the UV photon energy, the UV exposure time and/or the UV lamp or laser pulsing rate. The integrated intensity of the UV irradiation at the substrate surface over the range of 180–400 nm is at least 50 mW/cm$^2$, more preferably at least 200 mW/cm$^2$. A typical broadband UV source useful in the invention will provide an integrated intensity over the 180–400 nm range of about 250 mW/cm$^2$ with an intensity at 254±5 nm of about 25 mW/cm$^2$.

High intensity collimated UV light can be focused on certain sections of the substrate. These sections can be certain locations on the device structure or these sections can be at certain angles with respect to the substrate's planar surface. These sections will have an enhanced rate of ligand reaction. Volatile metal-ligand complexes will form more readily at these locations and the removal rate of metal-containing contaminants will be enhanced. Thus, specific areas or topologies may be etched or cleaned faster. Using this kind of technique, under-cutting of metal lines, mask lift-off, and other metal-removal problems can be addressed.

This invention has several process advantages, including, without limitation, the following: First, UV processes are preferable over gas plasma processes. Direct exposure of beta-diketone and beta-ketoimine ligand forming compounds to plasma results in destruction of the ligand forming compounds whereas these UV processes do not destroy the compounds. Also, plasma processes automatically have effluents and these effluents may contaminate the wafer with sputtering residues.

Second, exposing to UV irradiation during reaction of a beta-diketone and beta-ketoimine ligand forming compound with volatilizable forms of metals actually may enhance the volatilizability of the resulting ligand compound. Since their volatilizability is increased, the reaction rate with the compounds is increased.

Third, trace metal contaminants may be embedded in the silicon or oxide surface and the UV exposure may etch away some surface layers and dislodge the contaminants as well as place them in a volatilizable form.

Fourth, since the speed and amount of the elimination of the trace metals depends on the UV exposure, a directional process can be developed. In particular, irradiation normal to the substrate can reduce under cutting or under etching of lines, providing steeper line walls. Further, using focused high intensity collimated UV light on certain locations on the wafer surface, the removal rate will be selectively enhanced on these locations. Since the removal rate is faster, more metals are removed in these specific areas. If desired, focusing techniques can be employed so that over etching or under etching of sidewalls can occur. In such a manner, compensation can be made for the line width lost in transferring the lithographic pattern to the etched metal. Thus, this UV combined with the beta-diketone and beta-ketoimine ligand forming process can be used to solve step coverage problems. These step coverage problems have plagued process development and manufacturing engineers for years The following example illustrates the invention and is not intended to restrict the scope of the invention.

EXAMPLE

First, an experimental control group was set up. CVD copper films, approximately 1500–2000 Å in thickness, were deposited on 150 mm silicon substrate and subsequently oxidized in air at 275° C. for about 16 hours. The wafers were inserted into a prototype UV process module and the module was pumped down to approximately 10 mtorr. HFAC was flowed into the chamber at 8–12 sccm in 75–125 sccm of nitrogen carrier gas. The reactor pressure was controlled at 90–110 torr. The wafers were exposed for 4–6 minutes, after which the HFAC flow was stopped and the reactor was pumped back down to 10 mtorr. Trials were run with the substrate temperature at 35°–45° C. and at 145°–155° C. According to ellipsometer readings, no etching of the CuO was detected.

The UV/beta-diketone test process involved the same HFAC flow and pressure conditions. Here, the CuO films were exposed to UV light from a medium pressure mercury discharge lamp with an intensity at the wafer surface of about 250 mW/cm² in the wavelength range of 200–400 nm. The infrared and visible output from the lamp typically cause the substrate temperature to reach 245°–255° C. in 4–6 minutes of exposure. The CuO film was found to be nearly completely etched from the wafer. Some residual unoxidized metallic copper appeared to remain. It was estimated that thermal effects should have contributed to no more than 10 Å/minute of CuO etching while nearly 400 Å/minute of copper etching was observed. Also, the known intensity distribution of the UV lamp source appeared in the etching pattern of the CuO film. Both of these results point to the UV light as directly enhancing the rate of CuO etching by HFAC.

What is claimed is:

1. A method of removing an oxidized metallic material from a portion of the surface of a substrate, the method comprising irradiating the substrate surface portion with ultraviolet light and simultaneously exposing the substrate surface portion to a gaseous environment comprising a ligand forming compound selected from the group consisting of beta-diketone and beta-ketoimine ligand forming compounds so as to form a metal-ligand compound and volatilizing said metal-ligand compound.

2. A method according to claim 1, wherein the substrate surface portion is irradiated with ultraviolet light in an environment comprising a gas selected from the group consisting of halogen and ozone gases.

3. A method according to claim 1, wherein the substrate surface portion comprises sections of the substrate surface and the ultraviolet light comprises a high intensity collimated beam which is focused on said sections of the substrate surface.

4. A method according to claim 1, wherein said substrate surface portion is less than the total surface of the substrate.

5. A method according to claim 1, wherein the oxidized metallic material is selected from the group consisting of the oxidized forms of Cu, Fe, Ni, Au, Sb, In, Cr, Al, Yb, Mn and Pb.

6. A method according to claim 1, wherein the oxidized metallic material is selected from the group consisting of metal chlorides, fluorides, bromides, iodides, and oxides.

7. A method according to claim 1, wherein the substrate surface portion is made of a material selected from the group consisting of silicon, silicon oxides, and gallium arsenide.

8. A method according to claim 7, wherein the substrate surface portion is a film of silicon oxide material selected from the group consisting of a doped oxide, a CVD oxide, and a thermal oxide.

9. A method according to claim 8, wherein the silicon oxide material is a doped oxide selected from the group consisting of boron and phosphorus doped silica glass, phosphorous doped silica glass, boron doped silica glass, and spin on glass.

10. A method according to claim 1, wherein the substrate surface portion has a composite film structure including alternating layers of undoped silicon oxide and doped silicon oxide.

11. A method according to claim 1 wherein the ligand forming compounds are dispersed in the gaseous environment, the gaseous environment maintained at a temperature below that required to form a volatile metal-ligand complex on the surface of the substrate without ultraviolet irradiation.

12. A method according to claim 1, wherein the ligand forming compound is represented by the formula:

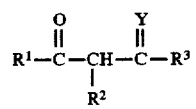

wherein:

R¹ and R³ are independently selected from a linear or branched non-fluorinated, partially-fluorinated or fully fluorinated alkyl, alkenyl or aryl group having from 1 to about 8 carbon atoms;

R² is a hydrogen atom, a fluorine atom or a linear or branched non-fluorinated, partially-fluorinated or fully fluorinated alkyl or alkenyl group having from 1 to about 8 carbon atoms; and Y is selected from an oxygen atom; N—R⁴ wherein R⁴ is selected from a non-fluorinated, partially fluorinated, or fully fluorinated alkyl, aryl, aralkyl or hydroxyalkyl group having from 1 to about 10 carbon atoms, or Y is

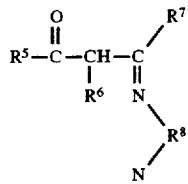

wherein:

R⁵, R⁶, and R⁷ are independently selected from a hydrogen atom, a fluorine atom or a linear or branched non-fluorinated, partially fluorinated or fully fluorinated alkyl or alkenyl group having from 1 to about 8 carbon atoms; and R⁸ is a linear or branched non-fluorinated, partially fluorinated or fully fluorinated alkylene, alkenylene, phenylene, alkylphenylene or hydroxalkylene group having from 1 to about 8 carbon atoms.

13. A method according to claim 12 wherein said ligand forming compound is a member of the group consisting of:

1,1,1,5,5,5-Hexafluoro-2,4-pentanedione;

4-(2,2,2-trifluoroethyl)-imine-1,1,1,5,5,5-hexafluoro-2-pentanone;

5-(2,2,2-trifluoroethyl)imino-1,1,1,2,2,6,6,6-octafluoro-3-hexanone;

6-(2,2,2-trifluoroethyl)imino-1,1,1,2,2,3,3,7,7,7-decafluoro-4-heptanone;

4-(phenyl)imino-1,1,1,5,5,5-hexafluoro-2-pentanone;

4-(2-hydroxyethyl)imino-1,1,1,5,5,5-hexafluoro-2-pentanone;

1,2-di(4-imino-1,1,1,5,5,5-hexafluoro-2-pentanone)ethane;

1,2-di(5-imino-1,1,1,2,2,6,6,6-octafluoro-3-hexanone) ethane;

1,2-di(6-imino-1,1,1,2,2,3,3,7,7,7-decafluoro-4-heptanone) ethane;

bis[4-(methylene)imino-1,1,1,5,5,5-hexafluoro-2-pentanone]methane; and bis(4-(methylene)imino-1,1,1,5,5,5-hexafluoro-2-pentanone]methanol.

14. A method according to claim 13 wherein said ligand forming compound is 1,1,1,5,5,5-Hexafluoro-2,4-pentanedione.

15. A method according to claim 1, wherein the substrate is maintained at a temperature in the range of 50° C. to 400° C. during exposure to said ligand forming compound.

16. A method according to claim 15, wherein said substrate is maintained at a temperature in the range of 100° C. to 300° C.

17. A method according to claim 1, wherein the gaseous environment is characterized by a total pressure less than or equal to 1 atmosphere.

18. A method according to claim 1, wherein the gaseous environment is maintained at a total pressure in the range of 90-110 torr.

19. A method according to claim 1, wherein the ligand forming compound is characterized by a flow rate in the range of 5-500 sccm and the gaseous environment is characterized by a flow rate in the range of 100-2000 sccm.

20. A method according to claim 1, wherein the ligand forming compound comprises 1-40 percent of said gaseous environment.

21. A method according to claim 1, wherein said ligand forming compound is maintained in a concentration range of 5-25 percent of said gaseous environment.

22. A method according to claim 1, which comprises the steps of evacuating a chamber containing the substrate to a pressure less than 10 torr, providing the chamber containing the substrate with a gas selected from the group consisting of halogen and ozone, irradiating the substrate surface portion with ultraviolet radiation in the wavelength range of 200-400 nm, flowing the ligand forming compound into the chamber with an inert carrier gas, irradiating the substrate surface portion with ultraviolet radiation while it is exposed to said gaseous environment, said gaseous environment being maintained at below atmospheric pressure, and said substrate being maintained at a temperature of 50°-400° C., and then discontinuing flowing the ligand forming compound into the chamber with an inert carrier gas and evacuating the chamber to remove reactant and product gases.

23. A method of removing a metallic material from a portion of the surface of a substrate, the method comprising irradiating the substrate with ultraviolet light in a gaseous environment, the environment comprising first and second reactant gases, the first reactant gas selected from the group consisting of halogen and ozone gases and the second reactant gas selected from the group consisting of beta-diketone and beta- ketoimine ligand forming compounds, and maintaining the substrate at a temperature sufficient to form a volatile metal-ligand complex on the surface of the substrate from the metallic material and volatilizing the volatile metal-ligand complex thus formed on the substrate.

24. A method of removing a metallic material from the surface of a substrate, the method comprising irradiating the substrate with ultraviolet light in a first gaseous environment comprising a first reactant gas of ozone, discontinuing the ultraviolet light irradiation, providing a second gaseous environment to the substrate said second gaseous environment being at below ambient pressure and comprising a second reactant gas selected from the group consisting of beta-diketone and beta-ketoimine ligand forming compounds, and maintaining the substrate at a temperature sufficient to form a volatile metal-ligand complex on the surface of the substrate and volatilizing the volatile metal-ligand complex.

* * * * *